United States Patent
Shih

(10) Patent No.: US 6,320,426 B1
(45) Date of Patent: Nov. 20, 2001

(54) SELF-CALIBRATING CIRCUIT OF HIGH SPEED COMPARATOR

(75) Inventor: Her-Y Shih, Taichung (TW)

(73) Assignee: Topic Semiconductor Corp., Hsinchu (TW)

( * ) Notice: Subject to any disclaimer, the term of this patent is extended or adjusted under 35 U.S.C. 154(b) by 0 days.

(21) Appl. No.: 09/750,461

(22) Filed: Dec. 28, 2000

(30) Foreign Application Priority Data

Dec. 18, 2000 (TW) .................................................. 89127056

(51) Int. Cl.[7] .................................................. H03K 5/22
(52) U.S. Cl. .................................................. 327/65; 327/68
(58) Field of Search .................................. 327/52, 55, 63, 327/65, 68, 90, 91, 93, 94, 95, 96, 563

(56) References Cited

U.S. PATENT DOCUMENTS 4,602,167 * 7/1986 Yukawa .................................... 327/65
5,032,744 * 7/1991 Wai Yeung Liu ....................... 327/55

* cited by examiner

Primary Examiner—Kenneth B. Wells
Assistant Examiner—Paul Dinh
(74) Attorney, Agent, or Firm—Jiawei Huang; J.C. Patents

(57) ABSTRACT

A self-calibrating circuit of a high speed comparator, having a first negative phase logic switch, a second negative logic switch, a first positive phase logic switch, a second positive phase logic switch, a third negative phase logic switch, a fourth negative phase logic switch, a third positive phase logic switch, a fourth positive phase logic switch, a fifth positive phase logic switch, a first current source circuit, a second current source circuit and a control logic circuit. Using the first and the second current source circuits, a self-calibration can be performed while the high speed comparator is just turned on, so that the input offset voltage of the high speed comparator can be eliminated.

4 Claims, 4 Drawing Sheets

SELF-CALIBRATING CIRCUIT OF HIGH SPEED COMPARATOR

CROSS-REFERENCE TO RELATED APPLICATION

This application claims the priority benefit of Taiwan application Ser. No. 89127056, filed Dec. 18, 2000.

BACKGROUND OF THE INVENTION

1. Field of the Invention

The invention relates in general to a comparator. More particularly, this invention relates to a comparator having the self-calibration function of eliminating the input offset voltage.

2. Description of the Related Art

In various kinds of analog/digital converters (ADC) such as flash ADC, interpolation ADC, pipeline ADC and two-step ADC, a high speed comparator is often required to fulfill the requirements of high speed operation of the digital circuit.

FIG. 1 shows a circuit diagram of a conventional comparator. In FIG. 1, a PMOS latchp1 114, a PMOS latchp2 112, an NMOS latchn1 120 and an NMOS latchn2 118 are a set of regeneration stage circuits in the comparator 128. A PMOS resetp1 116 and a PMOS resetp2 110 are a set of reset circuits. An NMOS minm 122 and an NMOS minp 124 are a set of analog signal amplifiers, and an NMOS strb 126 is a switch determining whether the current of the whole comparator 128 is conducted.

In FIG. 1, when the low level latch signal is input from the latch terminal of the comparator 128, the NMOS strb 126 is open, and the NMOS resetp1 116 and the PMOS resetp2 110 are conducted. Thus, the output terminals outp and outm are reset to a voltage of vdda. When a high level latch signal is input from the latch terminal of the comparator 128, the NMOS strb 126 is conducted, and the NMOS resetp1 116 and the PMOS resetp2 110 are open. Therefore, the PMOS latchp1 114, the PMOS latchp2 112, the NMOS latchn1 120 and the NMOS latchn2 118 are regenerating. The input analog signal at the input terminal inp of the NMOS minp 124 is compared to the input analog signal at the input terminal inm of the NMOS minm 122 until the potential levels between the output terminals outp and outm are distinguished from each other.

If mismatch occurs to the NMOS minm 122 and the NMOS minp 124, or to the PMOS latchp1 114, the PMOS latchp2 112, the NMOS latchn1 120 and the NMOS latchn2 118 of the regeneration circuit, a large input offset voltage is caused at the input terminals inp and inm. The accuracy of the comparator 128 is thus seriously affected. In the actual circuit design, one can increase the transistor size to reduce the degree of mismatch, however the fabrication cost is raised, the power consumption is increased, and the operation speed is reduced (since the parasitic capacitance is increased).

SUMMARY OF THE INVENTION

The invention provides a self-calibrating circuit of a high speed comparator. The self-calibrating circuit provides a self-calibration when the comparator is just turned on to eliminate the input offset voltage of the comparator.

The self-calibrating circuit of the high speed comparator is supplied with a power by a first and a second voltage source. The self-calibrating circuit comprises a latch control terminal, a first analog input terminal, a second analog input terminal, a first digital output terminal and a second digital terminal. The latch control terminal receives a latch signal, the first analog input terminal receives a first analog signal, the second analog input terminal receives a second analog signal. The first digital output terminal outputs a first digital signal, the second digital output terminal outputs a second digital signal.

The self-calibrating circuit further comprises first to fourth negative phase logic switches, first to fifth positive phase logic switches, a first and a second current source circuits, and a control logic circuit. The first negative phase logic switch comprises a power source terminal coupled to the first voltage source, a load terminal coupled to the first digital output terminal, and a control terminal coupled to the latch control terminal. The second negative phase logic switch comprises a power source terminal coupled to the first voltage source, a load terminal coupled to the first digital output terminal, and a control terminal coupled to the second digital output terminal. The first positive phase logic switch comprises a power source terminal coupled to the first digital output terminal, a control terminal coupled to the second digital output terminal, and a load terminal. The second positive phase logic switch comprises a power source terminal coupled to the load terminal of the first positive phase logic switch, a control terminal coupled to the first analog input terminal, and a load terminal. The third negative phase logic switch comprises a power source terminal coupled to the first voltage source, a load terminal coupled to the second digital output terminal, and a control terminal coupled to the latch control terminal. The fourth negative logic switch comprises a power source coupled to the first voltage source, a load terminal coupled to the second digital output terminal, and a control terminal coupled to the first digital output terminal. The third positive phase logic switch comprises a power source terminal coupled to the second digital output terminal, a control terminal coupled to first digital output terminal, and a load terminal. The fourth positive output terminal comprises a power source terminal coupled to the load terminal of the third positive phase logic terminal, a load terminal coupled to the load terminal of the second positive phase logic switch, and a control terminal coupled to the second analog input terminal. The fifth positive phase logic switch comprises a power source terminal coupled to the load terminal of the second positive phase logic switch, a load terminal coupled to the second voltage source, and a control terminal coupled to the latch control terminal. The first current source circuit comprises a power source terminal coupled to the first voltage source, a load terminal coupled to the load terminal of the first positive phase logic switch, and a control terminal. The second current source circuit comprises a power source terminal coupled to the first voltage source, a load terminal coupled to the load terminal of the third positive phase logic switch, and a control terminal. The control logic circuit comprises a calibration control terminal to receive a calibration signal, a latch signal input terminal, a first data output terminal, a second output terminal and a digital signal input terminal. The latch signal input terminal is coupled to the latch control terminal. The first data output terminal is coupled to the data control terminal of the first current source circuit. The second data output terminal is coupled to the data control terminal of the second current source circuit. The digital signal input terminal is coupled to the first digital output terminal.

Using the above self-calibrating circuit in a high speed comparator comprising the first current source circuit, the second current source circuit and the control logic circuit, a self-calibration is performed within a very short time after the high speed comparator is turned on. Therefore, the input offset voltage of the high speed comparator can be eliminated.

Both the foregoing general description and the following detailed description are exemplary and explanatory only and are not restrictive of the invention, as claimed.

DESCRIPTION OF THE PREFERRED EMBODIMENTS

Figure 1:
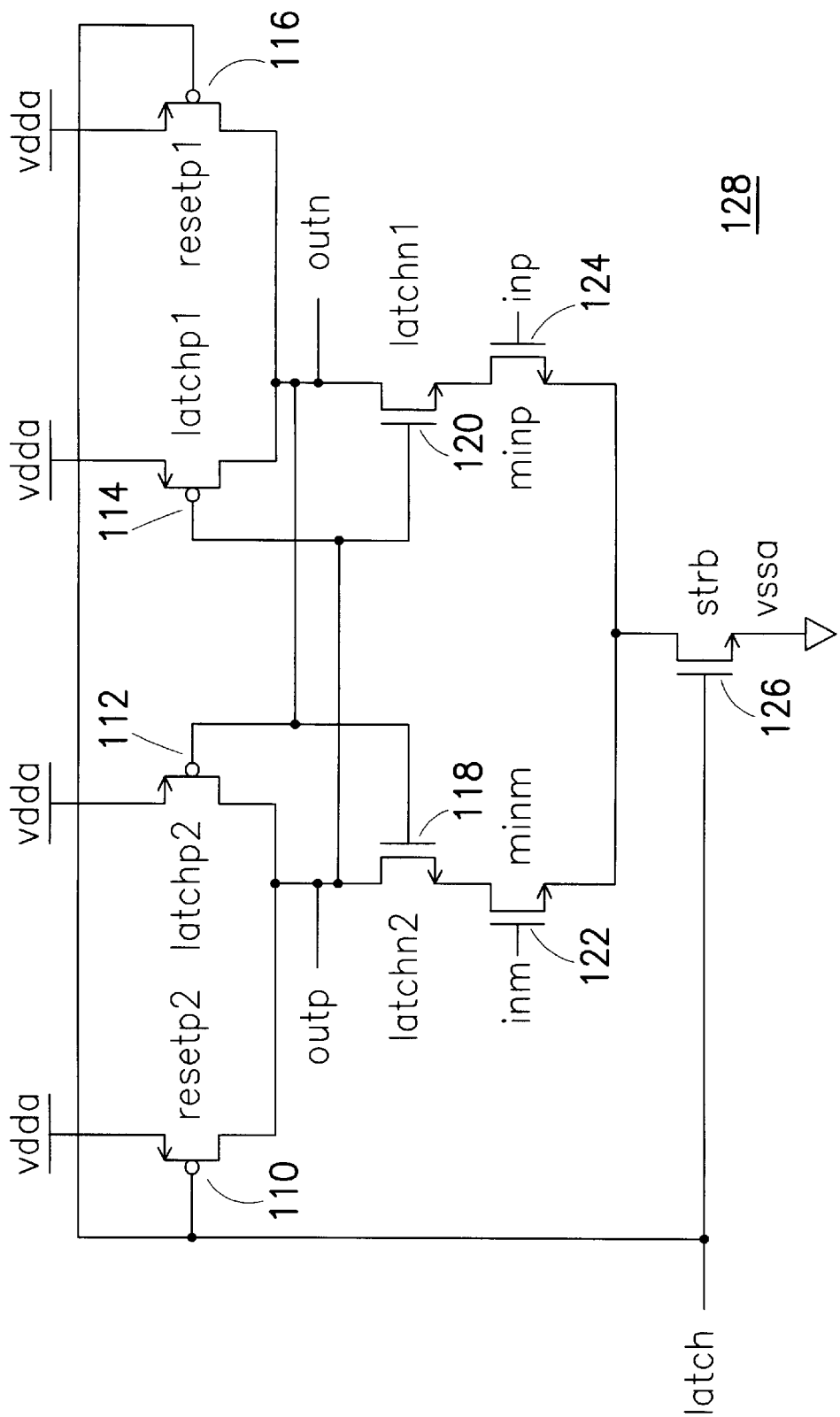
FIG. 1 is a circuit diagram of a conventional comparator.
Figure 2:
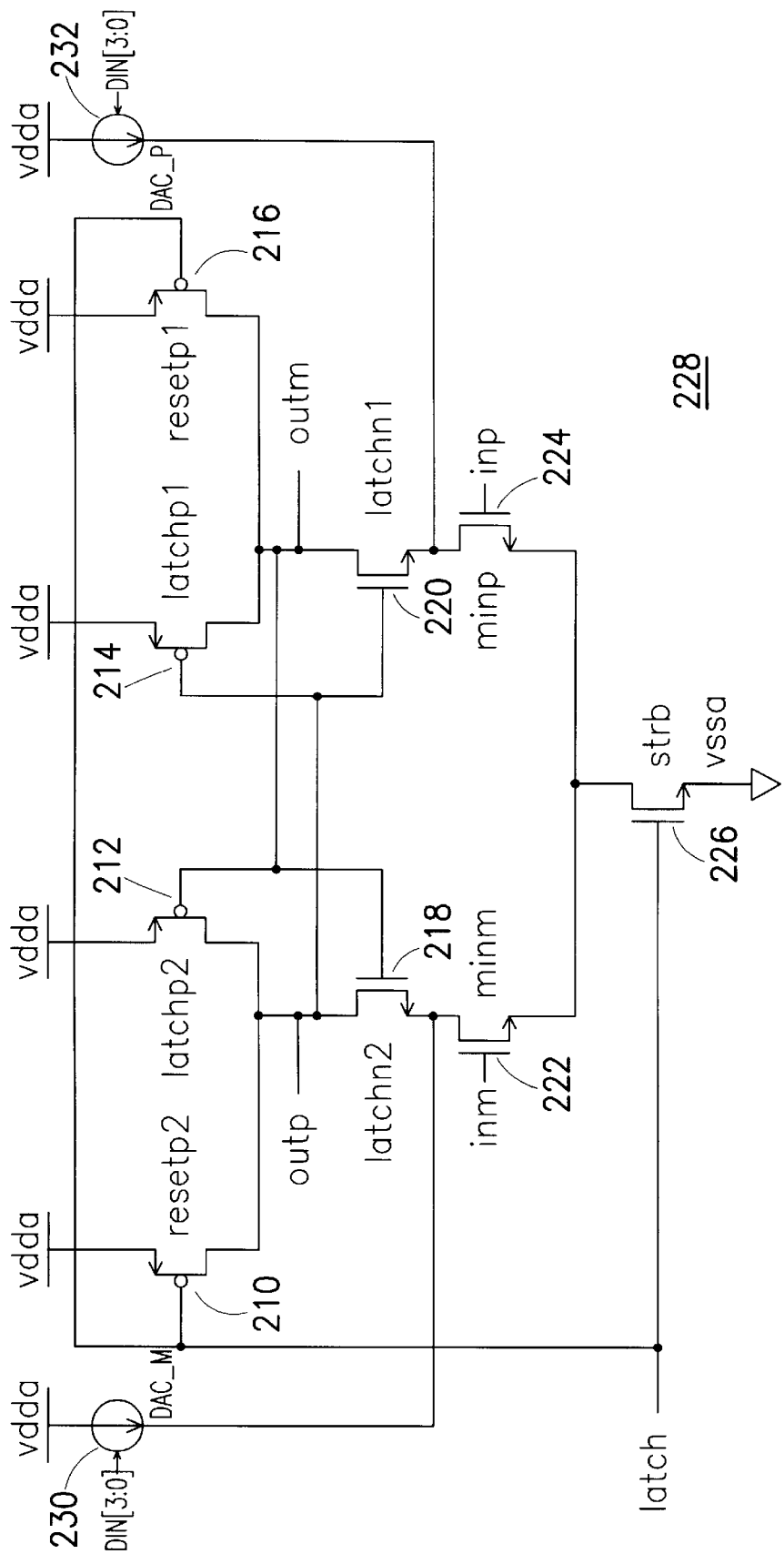
FIG. 2 shows a circuit diagram of a high speed comparator according to the invention.

Referring to FIG. 2, an embodiment of a high speed comparator according to the invention is illustrated. In FIG. 2, the voltage source vdda and the voltage source vssa provide power to the high speed comparator 228. The high speed comparator 228 has a latch control terminal latch, an analog input terminal inm, an analog input terminal inp, a digital output terminal outp, and a digital output terminal outm. The lath control terminal latch receives a latch signal. The analog input terminals inm and inp receive different analog signals. The digital output terminals outp and outm output complementary digital signals.

The comparator 228 comprises a PMOS resetp2 210, a PMOS latchp2 212, an NMOS latchn2 218, an NMOS minm 222, a PMOS resetp1 216, a PMOS latchp1 214, an NMOS latchn1 220, an NMOS minp 224, an NMOS strb 226, a current source circuit DAC_M 230, and a current source circuit DAC_P 232. The PMOS resetp2 210 comprises a power source terminal (source region) coupled to the voltage source vdda, a load terminal (drain region) coupled to the digital output terminal outp, and a control terminal (gate) coupled to the latch control terminal latch. The PMOS latchp2 212 comprises a power source terminal coupled to the voltage source vdda, a load terminal coupled to the digital output terminal outp, and a control terminal coupled to the digital output terminal outm. The NMOS latchn2 comprises a power source terminal (drain region) coupled to the digital output terminal outp, a control terminal (gate) coupled to the digital output terminal outm, and a load terminal (source). The NMOS minm 222 comprises a power source terminal coupled to the load terminal of the NMOS latchn2 218. The NMOS minm 222 comprises a control terminal coupled to the analog input terminal inm.

The PMOS resetp1 216 comprises a power source terminal coupled to the voltage source vdda, a load terminal coupled to the digital output terminal outm, and a control terminal coupled to the latch control terminal latch. The PMOS latchp1 214 comprises a power source terminal coupled to the voltage source vdda, a load terminal coupled to the digital output terminal outm and a control terminal coupled to the digital output terminal outp. The NMOS latchn1 220 comprises a control terminal coupled to the digital output terminal outp. The NMOS minp 224 comprises a power source terminal coupled to a load terminal of the NMOS latchn1 220 and a control terminal coupled to the analog input terminal inp.

The NMOS strb 226 comprises a power source terminal coupled to a load terminal of the NMOS minm 222, a load terminal coupled to the voltage source vssa, and a control terminal coupled to the latch control terminal latch. The current source circuit DAC_M 230 comprises a power source terminal coupled to the voltage source vdda, a load terminal coupled to a load terminal of the NMOS latchn2 218, and a data control terminal DIN[3:0] to receive a data. The current source circuit DAC_P 232 comprises a power source terminal coupled to the voltage source vdda, a load terminal coupled to the load terminal of the NMOS latchn1 220, and a data control terminal DIN[3:0] to receive a data.

In FIG. 2, to easily use the digital circuit to calibrate the input offset voltage, a current mode digital-to-analog current converter (current DAC, not shown in FIG. 2) is employed. The magnitude of current flowing into the high speed comparator 228 from the current source circuits DAC_M 230 and DAC_P 232 is controlled by the input data. The input offset voltages of the analog input terminals inm and inp of the high speed comparator 228 are thus varied. Meanwhile, the currents output from the current source circuits DAC_M 230 and DAC_P 232 are inversely proportional. That is, when current flowing from the current source circuit DAC_M 230 increases a certain amount, the current flowing from the current source circuit DAC_P 232 decreases the exact amount that the current source circuit DAC_M 230 increases.

Using the circuit as shown in FIG. 2 as an example, assuming that the voltage of the analog input terminal inp is higher than the voltage of the analog input terminal inm, the input data causes the current flowing from the current source circuit DAC_M 230 to increase. As a result, the voltages at the power source terminal and the control terminal of the NMOS minm 222 rise, that is, the analog input terminal inm is pulled up. In contrast, this input data causes the current flowing from the current source circuit DAC_P 232 to decrease. Consequently, the voltages of the power source terminal and the control terminal of the NMOS minp 224 are lowered, that is, the voltage of the analog input terminal inp is dropped. Thus, only by adjusting the data input to the current source circuits DAC_M 230 and DAC_P 232, can the input offset voltages of the analog input terminals inm and inp be eliminated.

Figure 3A:
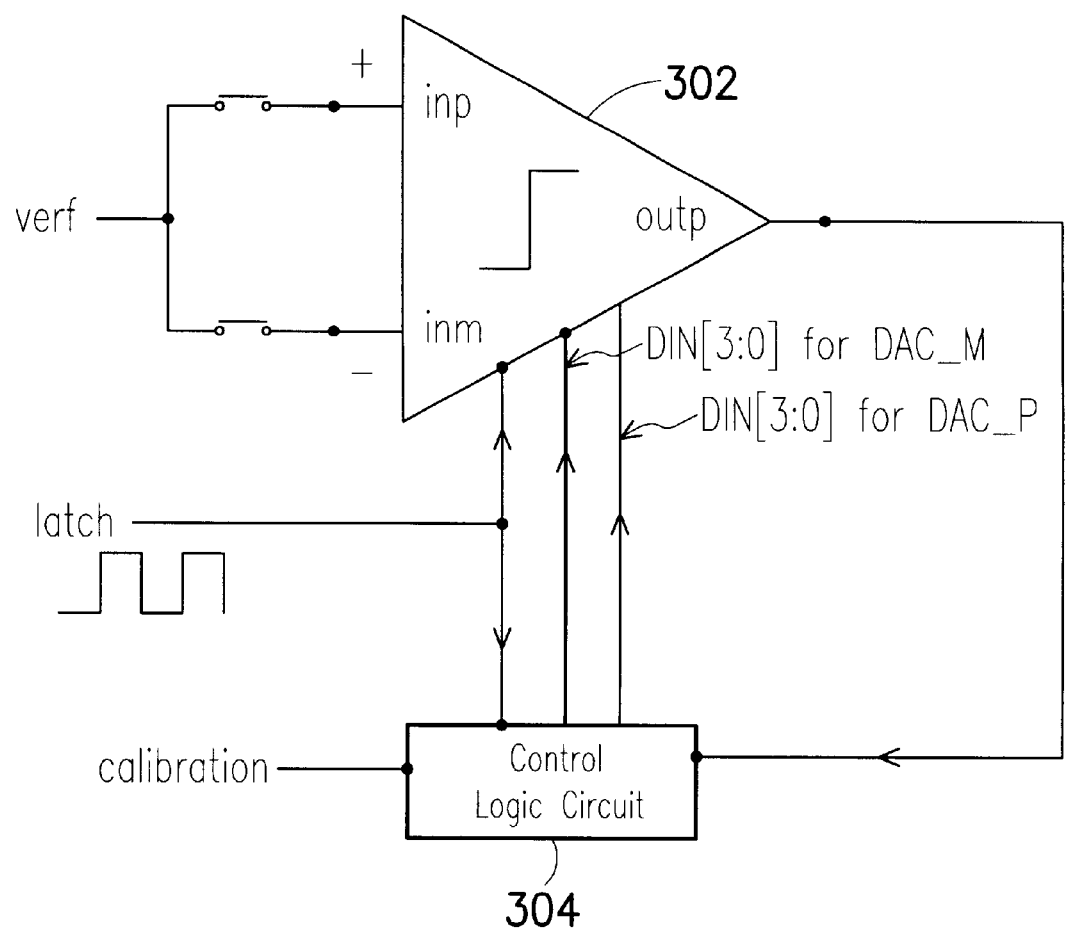
FIG. 3A shows a circuit diagram of the high speed comparator in a self-calibration status according to the invention.

FIG. 3A is a block diagram of a self-calibrating circuit of a high speed comparator. The high speed comparator 302 is a simplified form of the high speed comparator as shown in FIG. 2. A control logic circuit 304 comprises a calibration terminal calibration to receive a calibration signal, a latch signal input terminal coupled to the latch control terminal of the high speed comparator 302, a first data output terminal, a second data output terminal and a digital signal input terminal. The first data output terminal is coupled to the data control terminal DIN[3:0] of the current source circuit DAC_M230 (as shown in FIG. 2). The second data output terminal is coupled to the data control terminal DIN[3:0] of the current DAC_P 232 (as shown in FIG. 2). The digital signal input terminal is coupled to the digital output terminal outp of the high speed comparator 302.

In this embodiment, the comparator is designed to perform a self-calibration operation a short period of time after power on. The method of calibration is described as follows.

When the calibration control terminal of the control logic circuit 304 receives a calibration signal "H" from an external circuit, it indicates that the high speed comparator 302 is performing a self-calibration operation. Meanwhile, the analog input terminals inp and inm receive a reference voltage vref simultaneously. As the voltages of both the analog input terminals inp and inm are the same, the digital output terminal outp is "H" or "L" under the ideal condition (that is, the input offset bias voltage is zero). That is, digital output terminal outp is at a high or low voltage level with a probability of ½ for each one. Meanwhile, the data output from the first data output terminal of the control logic circuit 304 to the current source circuit DAC_M 230 is [1000] (a four-digital data is used as an example in this embodiment). The data output from the second data output terminal of the control logic circuit 304 to the current source circuit DAC_P 232 is also [1000]. It is shown that the currents flowing from the current source circuits DAC_M 230 and DAC_P 232 are the same.

If input offset voltage occurs to the analog input terminals inp and inm, and assuming the digital output terminal outp is "H", the latch signal input terminal of the control logic circuit 304 continuously receives four latch signal clocks (the embodiment uses 4 clock time as an example), the signal output from the digital output terminal outp is "H", and the data output from the second data output terminal causes an increase of current flowing from the current source circuit DAC_P 232 (referring to FIG. 2). Meanwhile, the current flowing from the first data output terminal of the control logic circuit 304 is decreased. Thus, the input offset voltage of the analog input terminal inp and inm is calibrated. By iterating the same procedure for a period of time, the digital output terminal outp of the high speed comparator 302 outputs an "L" signal. The data of the data control terminals DIN[3:0] of the current source circuits DAC_M 230 and DAC_P 232 are at a certain value, for example, the data of the data control terminal DIN[3:0] of the current source circuit DAC_M 230 is [1101]. After a period to time, for example, 1024 clock cycles, the calibration operation stops, and the calibration of the input offset voltage of the analog input terminals inp and inm is complete.

Figure 3B:
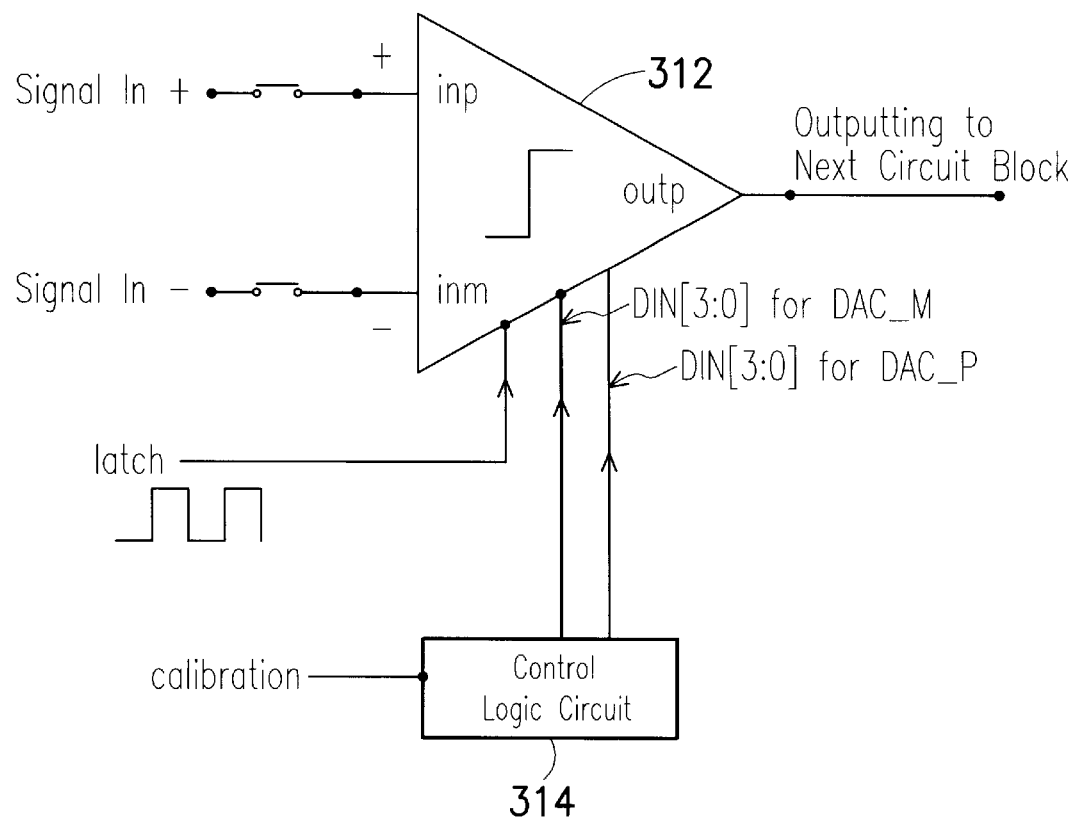
FIG. 3B shows a circuit diagram of the high speed comparator in a normal operation condition according to the invention.

FIG. 3B illustrates the self-calibrating circuit of the high speed comparator under the normal operation condition. In FIG. 3B, when the calibration signal received by the calibrating control terminal from an external circuit is converted from "H" to "L", the high speed comparator 312 is operated under a normal operation condition. The analog input terminals inp and inm of the high speed comparator 312 receive different analog signals to compare. The comparison result is output from the digital output terminal outp to a next circuit block (not shown). Meanwhile, the first and second data output terminals of the control logic circuit 314 output constant data to the current source circuits DAC_M 230 and DAC_P 232, respectively. The latch signal input terminal of the control logic circuit 314 no longer receives the latch signal (equivalent to an open status), and the digital input terminal stops receiving the digital signal output from the digital output terminal outp. The control logic circuit 314 is in an idle status.

The invention provides a self-calibrating circuit of a high speed comparator. Two current source circuits and a control logic circuit are used. A self-calibrating step is performed after a short period of time after the high speed comparator is on. The input offset voltage of the high speed comparator is thus eliminated.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A self-calibrating circuit of a high speed comparator, supplied with a power source from a first voltage source and a second voltage source, wherein the high speed comparator comprises a latch control terminal, a first analog input terminal, a second analog input terminal, a first digital output terminal, and a second digital output terminal, the latch control terminal receives a latch signal, the first analog input terminal receives a first analog signal, the second analog input terminal receives a second analog signal, the first digital output terminal outputs a first digital signal, and the second digital output terminal outputs a second digital signal, the self-calibrating circuit comprising:

a first negative phase logic switch, comprising a power source terminal coupled to the first voltage source, a load terminal coupled to the first digital output terminal, and a control terminal coupled to the latch control terminal;

a second negative phase logic switch, comprising a power source terminal coupled to the first voltage source, a load terminal coupled to the first digital output terminal, and a control terminal coupled to the second digital output terminal;

a first positive phase logic switch, comprising a power source terminal coupled to the first digital output terminal, a control terminal coupled to the second digital output terminal, and a load terminal;

a second positive phase logic switch, comprising a power source terminal coupled to the load terminal of the first positive phase logic switch, a control terminal coupled to the first analog input terminal, and a load terminal;

a third negative phase logic switch, comprising a power source terminal coupled to the first voltage source, a load terminal coupled to the second digital output terminal, and a control terminal coupled to the latch control terminal;

a fourth negative phase logic switch, comprising a power source terminal coupled to the first voltage source, a load terminal coupled to the second digital output terminal and a control terminal coupled to the first digital output terminal;

a third positive phase logic switch, comprising a power source terminal coupled to the second digital output terminal, a control terminal coupled to the first digital output terminal and a load terminal;

a fourth positive phase logic switch, comprises a power source terminal coupled to the load terminal of the third positive phase logic switch, a load terminal coupled to the load terminal of the second positive phase logic switch, and a control terminal coupled to the second analog input terminal;

a fifth positive phase logic switch, comprising a power source terminal coupled to the load terminal of the second positive phase logic switch, a load terminal coupled to the second voltage source, and a control terminal coupled to the latch control terminal;

a first current source circuit, comprising a power source terminal coupled to the first voltage source, a load terminal coupled to the load terminal of the first positive phase logic switch, and a data control terminal;

a second current source circuit, comprising a power source terminal coupled to the first voltage source, a load terminal coupled to the load terminal of the third positive phase logic switch, and a data control terminal; and a control logic circuit, comprising a calibration control terminal, a latch signal input terminal, a first data output terminal, a second data output terminal and a digital signal input terminal, wherein the calibration control terminal receives a calibration signal, the latch signal input terminal is coupled to the latch control terminal, the first data output terminal is coupled to the data control terminal of the first current source circuit, the second data output terminal is coupled to the data control terminal of the second current source circuit, and the digital signal input terminal is coupled to the first digital output terminal.

2. The self-calibrating circuit according to claim 1, wherein the first to fourth negative phase logic switches, the first to fifth positive phase logic switches, and the first and second current source circuits form the high speed comparator.

3. The self-calibrating circuit according to claim 1, wherein first to fourth negative phase logic switches include PMOS transistors.

4. The self-calibrating circuit according to claim 1, wherein first to fifth negative phase logic switches include NMOS transistors.

* * * * *